US010668594B2

(12) United States Patent
Ando

(10) Patent No.: US 10,668,594 B2
(45) Date of Patent: Jun. 2, 2020

(54) FRAME FIXING JIG

(71) Applicant: DISCO CORPORATION, Tokyo (JP)

(72) Inventor: Shigeru Ando, Tokyo (JP)

(73) Assignee: DISCO CORPORATION, Tokyo (JP)

(*) Notice: Subject to any disclaimer, the term of this patent is extended or adjusted under 35 U.S.C. 154(b) by 148 days.

(21) Appl. No.: 15/725,792

(22) Filed: Oct. 5, 2017

(65) Prior Publication Data
US 2018/0099375 A1   Apr. 12, 2018

(30) Foreign Application Priority Data

Oct. 7, 2016   (JP) .................................. 2016-198871

(51) Int. Cl.
*B24B 41/06*   (2012.01)
*B24B 7/22*   (2006.01)
*H01L 21/683*   (2006.01)

(52) U.S. Cl.
CPC .............. *B24B 41/06* (2013.01); *B24B 7/228* (2013.01); *H01L 21/6836* (2013.01)

(58) Field of Classification Search
CPC ....... B25B 11/00; B25B 11/005; B25B 11/02; B28D 5/0082; H01L 21/304; H01L 21/3043; H01L 21/50; H01L 21/67092; H01L 21/68; H01L 21/683; H01L 21/687; H01L 21/6836; H01L 61/68721; B24B 1/06; B24B 7/228
USPC ......... 269/55, 309, 310, 289 R, 21; 451/283, 451/284, 285, 286, 287, 288
See application file for complete search history.

(56) References Cited

U.S. PATENT DOCUMENTS

| 6,303,010 B1 * | 10/2001 | Woodruff | H01L 21/288 204/297.01 |
| 6,837,776 B2 * | 1/2005 | Shimobeppu | B24B 37/30 451/287 |
| 2009/0186562 A1 * | 7/2009 | Kajiyama | B24B 27/0076 451/57 |
| 2010/0025908 A1 * | 2/2010 | Munakata | H01L 21/681 269/57 |
| 2010/0240222 A1 * | 9/2010 | Fyten | H01L 21/68721 438/745 |

FOREIGN PATENT DOCUMENTS

JP   2004-247660   *   9/2004   .......... H01L 21/034

* cited by examiner

*Primary Examiner* — Orlando E Aviles
*Assistant Examiner* — Robert F Neibaur
(74) *Attorney, Agent, or Firm* — Gree Burns & Crain Ltd.

(57) ABSTRACT

A frame fixing jig for mounting on a chuck table has a chuck portion for holding a workpiece in an annular frame, and a body portion for supporting the chuck portion. A frame support member (FSM) supports the annular frame, and a ring presses the frame against the FSM. The FSM has a through hole. The ring has an annular base portion and an engaging portion. The engaging portion can be inserted through the through hole, thereby engaging the FSM. The engaging portion includes a rotating shaft extending through the annular base portion, a knob fixed to the upper end of the shaft, and a plate fixed to the lower end. The surface around the lower end of the through hole or the upper surface of the plate is formed with an inclined surface for lowering the rotating shaft by rotating the plate inserted through the through hole.

2 Claims, 6 Drawing Sheets

FRAME FIXING JIG

BACKGROUND OF THE INVENTION

Field of the Invention

The present invention relates to a jig adapted to be mounted on a chuck table in fixing an annular frame supporting a workpiece such as a semiconductor wafer through an adhesive tape, wherein the workpiece is held on the chuck table in processing the workpiece.

Description of the Related Art

A platelike workpiece such as a semiconductor wafer is processed by a grinding apparatus in such a manner that the back side of the wafer is ground to reduce the thickness of the wafer to a predetermined thickness. Thereafter, the wafer is divided into individual device chips by using a cutting apparatus or the like. These device chips are used in various kinds of electronic equipment. The grinding apparatus includes a chuck table for holding the wafer and grinding means for grinding the wafer held on the chuck table. The wafer is ground by the grinding means in the following manner. A protective tape is attached to the front side of the wafer to protect the devices. The wafer is next held on the chuck table in the condition where the protective tape attached to the front side of the wafer is in contact with the upper surface of the chuck table. That is, the back side of the wafer held on the chuck table is exposed. Abrasive members included in the grinding means are brought into contact with the back side of the wafer to thereby grind the back side of the wafer.

In this grinding operation, the workpiece (wafer) is sometimes supported through an adhesive tape to an annular frame in the case that the workpiece has an outside shape different from the shape of a suction holding surface (upper surface) of the chuck table or in the case of grinding a plurality of workpieces or grinding a workpiece difficult to handle after grinding. The workpiece is attached to the adhesive tape in its central portion, and the annular frame is attached to a peripheral portion of the adhesive tape. Such a grinding mode using the annular frame is called "frame grinding." In this frame grinding, the annular frame is pressed down to a vertical position lower than that of the holding surface of the chuck table. Accordingly, the upper surface of the annular frame is set lower in level than the upper surface of the chuck table, so that the workpiece can be ground in the condition where the annular frame is not in contact with a grinding wheel (abrasive members).

In the grinding operation, the abrasive members are pressed against the wafer. Accordingly, the protective tape attached to the front side of the wafer is formed of a hard material such as polyethylene terephthalate (PET) resin, so as to prevent damage to a base layer forming the protective tape due to a grinding pressure applied from the abrasive members. That is, the base layer of the protective tape is formed of a hard material such as PET resin. As described above, in the case of the frame grinding, the annular frame must be set lower in level than the holding surface of the chuck table. Accordingly, the protective tape attached to the annular frame must be expanded to a size larger than the natural diameter of the protective tape. To expand the protective tape formed of a hard material difficult to expand, there is a case that a frame fixing jig for pressing down the protective tape is used (see Japanese Patent Laid-open No. 2004-247660, for example).

SUMMARY OF THE INVENTION

The frame fixing jig described in the above prior art has such a structure that a wedge-shaped lug is horizontally moved to slide and engage with an engaging portion, thereby pressing down the annular frame. In this structure, much time is required for the sliding movement of the wedge-shaped lug. Further, a grinding dust is generated during the grinding operation, and this grinding dust may enter a moving path of the wedge-shaped lug and may be deposited in the moving path. Accordingly, there is a possibility that the sliding movement of the wedge-shaped lug may be hindered by the grinding dust deposited in the moving path, so that the annular frame may not be reliably fixed and may be moved during the grinding operation.

It is therefore an object of the present invention to provide a frame fixing jig which can fix the annular frame quickly and reliably and can also eliminate the possibility that the fixation of the annular frame may be hindered by the grinding dust.

In accordance with an aspect of the present invention, there is provided a frame fixing jig adapted to be mounted on a chuck table composed of a chuck portion and a body portion for supporting the chuck portion, the chuck portion having a holding surface for holding a workpiece supported through an adhesive tape to an annular frame having an opening, the annular frame being attached to a peripheral portion of the adhesive tape so that the opening is closed by a central portion of the adhesive tape, the workpiece is attached to the central portion of the adhesive tape, the frame fixing jig including a frame support member having an upper surface for supporting the annular frame, the frame support member being adapted to be provided outside the chuck portion of the chuck table and fixed to the body portion of the chuck table, the frame support member having a through hole as an engaged portion; and a presser ring for pressing the annular frame against the frame support member, the presser ring having an annular base portion and an engaging portion supported to the annular base portion, the engaging portion being adapted to be inserted through the through hole of the frame support member, thereby engaging the frame support member; the engaging portion including a rotating shaft extending through the annular base portion, a knob fixed to the upper end of the rotating shaft, and a plate fixed to the lower end of the rotating shaft; the surface around the lower end of the through hole of the frame support member or the upper surface of the plate being formed with an inclined surface for lowering the rotating shaft by rotating the plate inserted through the through hole; whereby when the knob is rotated about the axis of the rotating shaft to thereby rotate the plate inserted through the through hole, the upper surface of the plate comes into sliding contact with the surface around the lower end of the through hole of the frame support member, so that the rotating shaft is lowered by the operation of the inclined surface, and the lower surface of the knob is accordingly pressed against the upper surface of the annular base portion of the presser ring, thereby fixing the annular frame to the frame support member.

As described above, the frame fixing jig according to the present invention includes a frame support member having an upper surface for supporting the annular frame and a presser ring for pressing the annular frame against the frame support member. The frame support member is adapted to be provided outside the chuck portion of the chuck table and fixed to the body portion of the chuck table. The frame support member has a through hole as an engaged portion. The presser ring has an annular base portion and an engaging portion supported to the annular base portion. The engaging portion is adapted to be inserted through the through hole of the frame support member, thereby engaging the frame support member. The engaging portion includes a rotating shaft extending through the annular base portion, a knob fixed to the upper end of the rotating shaft, and a plate fixed to the lower end of the rotating shaft. The surface around the lower end of the through hole or the upper surface of the plate is formed with an inclined surface for lowering the rotating shaft by rotating the plate inserted through the through hole. With this arrangement, the annular frame can be fixed to the chuck table reliably and quickly only by rotating the knob by a predetermined angle, e.g., 90 degrees, wherein the knob may be rotated by an operator. Further, the operator can visually recognize the rotational angle of the knob in fixing the annular frame, so that the annular frame can be reliably fixed to the chuck table by the frame fixing jig. Accordingly, there is no possibility that improper fixation of the annular frame may be detected by any detecting means included in a grinding apparatus or the like, so that time and effort for re-fixation of the annular frame can be saved. Further, in grinding the workpiece, a grinding dust is generated from the workpiece. By using the frame fixing jig according to the present invention, the grinding dust is prevented from adhering to any portion where the reliably fixation of the annular frame is hindered by the deposition of the grinding dust. Accordingly, the reliably fixation of the annular frame is not hindered by the grinding dust.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
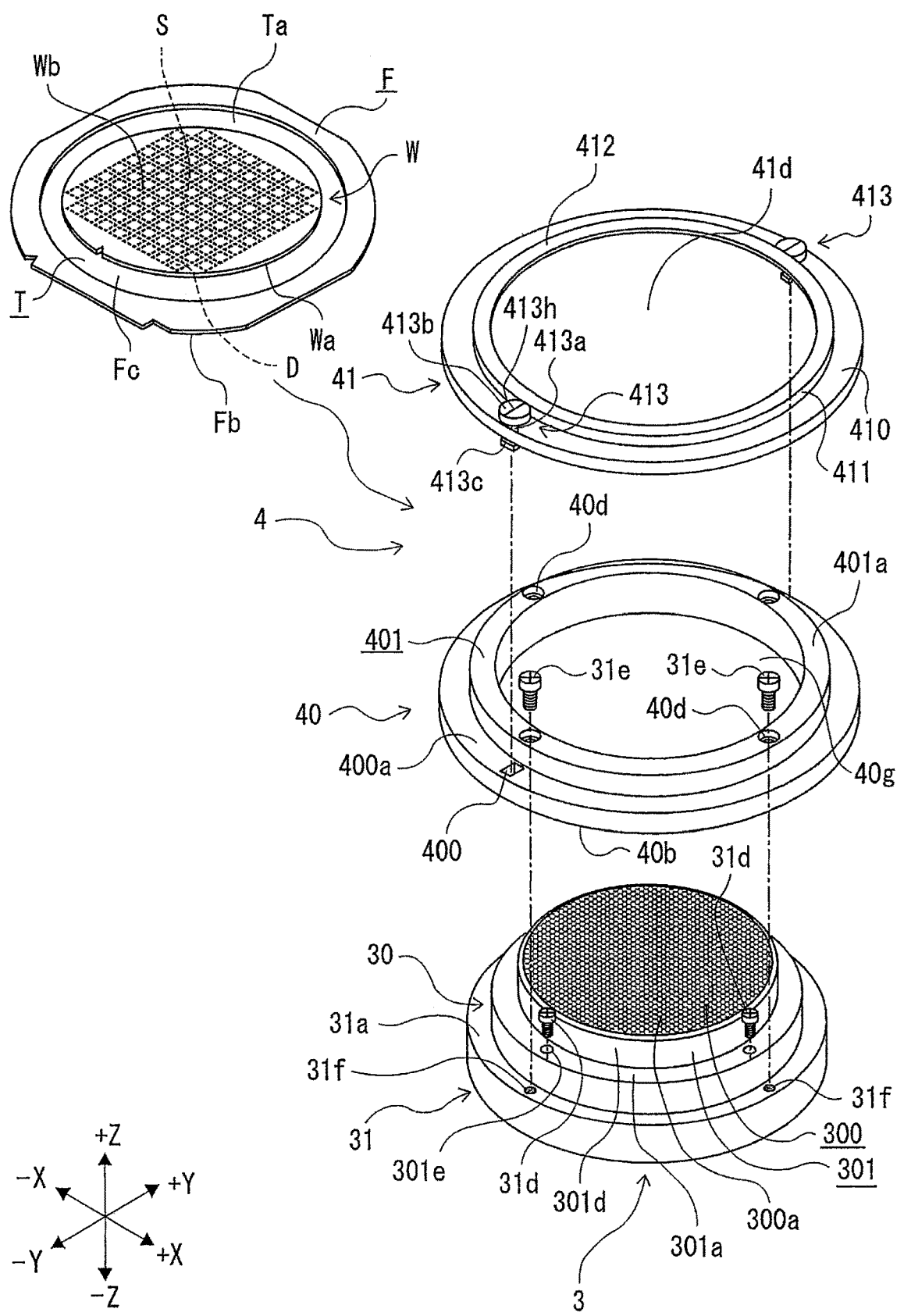
FIG. 1 is a perspective view of a chuck table, a frame fixing jig, and a wafer supported to an annular frame according to a preferred embodiment of the present invention.
Figure 2:
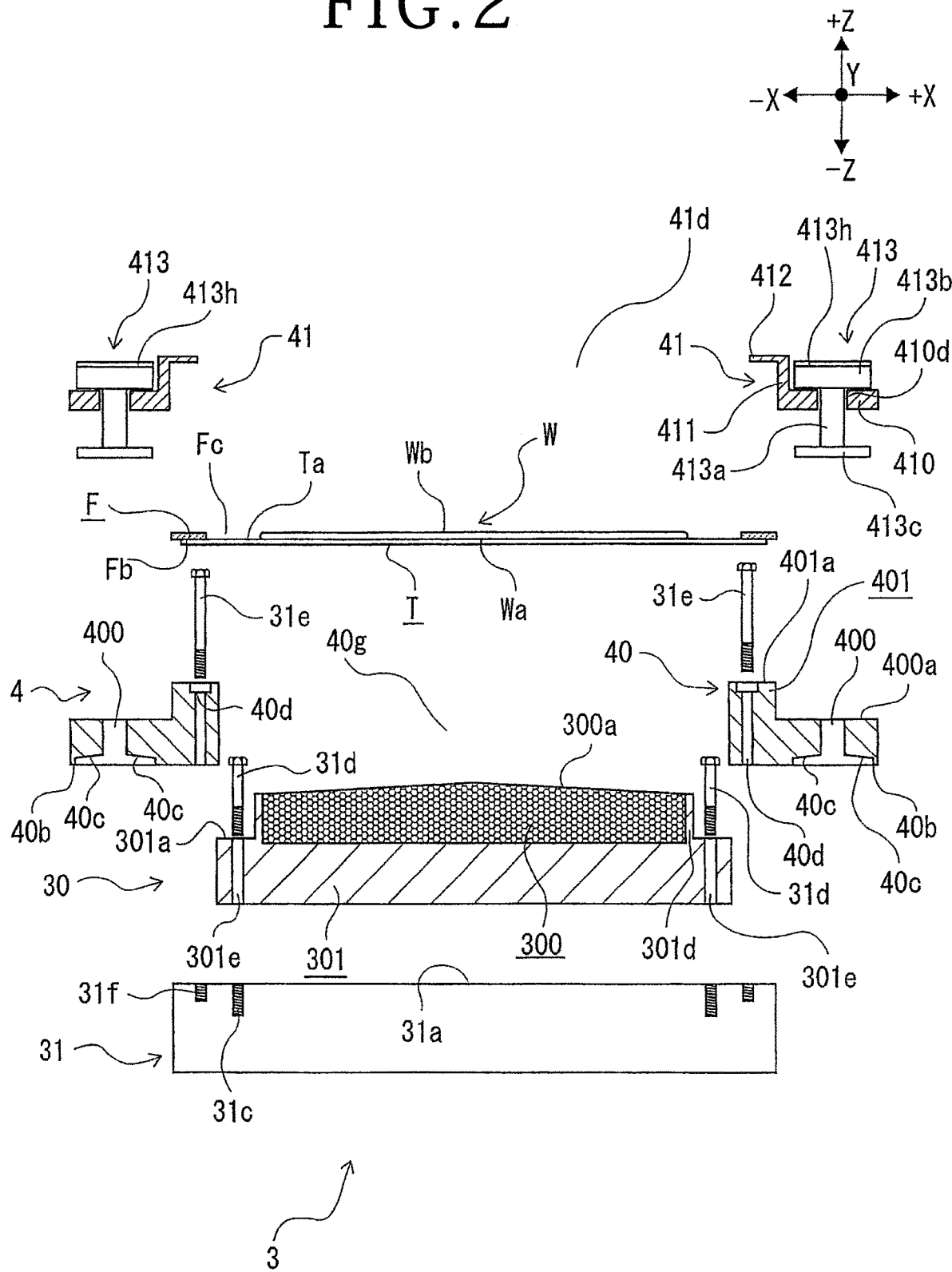
FIG. 2 is an exploded sectional side view of the chuck table, the frame fixing jig, and the wafer supported to the annular frame depicted in FIG. 1.

Referring to FIGS. 1 and 2, a wafer W as a workpiece is depicted. For example, the wafer W is a semiconductor wafer having a circular outside shape. The wafer W has a front side Wa (lower surface) and a back side Wb (upper surface). A plurality of devices D are formed on the front side Wa of the wafer W in a plurality of separate regions defined by a plurality of crossing division lines S. Reference symbol T denotes an adhesive tape, which is a circular sheet having an outer diameter larger than the outer diameter of the wafer W. The adhesive tape T is composed of a base layer and a paste layer formed on the base layer. For example, the base layer is formed of PET resin. The paste layer forms an adhesive surface Ta (upper surface).

Reference symbol F denotes an annular frame having a circular opening Fc. A peripheral portion of the adhesive surface Ta of the adhesive tape T is attached to the back side Fb (lower surface) of the annular frame F in such a manner that the opening Fc of the annular frame F is closed by the adhesive tape T. Further, the front side Wa of the wafer W is attached to the adhesive surface Ta of the adhesive tape T in the opening Fc of the annular frame F. The center of the wafer W almost coincides with the center of the opening Fc of the annular frame F. Thus, the wafer W is supported through the adhesive tape T to the annular frame F, wherein the adhesive tape T is attached to the annular frame F so as to close the opening Fc of the annular frame F. Accordingly, the wafer W can be handled by grasping or sucking the annular frame F. For example, even when the wafer W is ground to reduce the thickness of the wafer W to equal to or not more than 50 μm, it is possible to prevent the problem that such a very thin wafer may be bent and broken.

Referring to FIGS. 1 and 2, a chuck table 3 is also depicted. The chuck table 3 is generally composed of a chuck portion 30 and a body portion 31 for supporting the chuck portion 30. The chuck portion 30 has a holding surface 300a (upper surface) for holding the wafer W through the adhesive tape T under suction. The chuck portion 30 is composed of a porous plate 300 and a frame member 301 for supporting the porous plate 300. The porous plate 300 is formed of a porous material or the like. The porous plate 300 has a circular outside shape. The holding surface 300a of the chuck portion 30 is formed by an upper surface of the porous plate 300. The holding surface 300a of the porous plate 300 is exposed upward from the frame member 301. The holding surface 300a is formed as a conical surface having a vertex lying on the axis of the porous plate 300, wherein the conical surface is slightly inclined downward from the vertex toward the outer circumference, i.e., in the radially outward direction. When the chuck table 3 is set in a grinding apparatus or the like, the porous plate 300 is connected to a vacuum source such as a vacuum producing apparatus and a compressor, so that a suction force produced by the vacuum source is transmitted to the holding surface 300a, thereby holding the wafer W on the holding surface 300a under suction. That is, the wafer W is held under suction by the chuck portion 30.

The frame member 301 also has a circular outside shape. The upper surface of the frame member 301 is integrally formed with an annular support portion 301d for supporting the outer circumferential surface of the porour plate 300. That is, the annular support portion 301d projects from the upper surface of the frame member 301 in the +Z direction depicted by an arrow +Z. The annular support portion 301d forms an annular step height in such a manner that an annular surface 301a lower in height by a predetermined level than the upper end surface of the annular support portion 301d is formed radially outside of the annular support portion 301d. The annular surface 301a is formed with a plurality of bolt insertion holes 301e arranged at given intervals in the circumferential direction. For example, four bolt insertion holes 301e (only two being depicted in FIG. 2) are arranged at 90 degrees intervals. These bolt insertion holes 301e extend through the thickness of the frame member 301 in the Z direction.

As depicted in FIGS. 1 and 2, the body portion 31 for supporting the chuck portion 30 is a disk-shaped member formed of a predetermined alloy or the like. The body portion 31 has an upper surface 31a formed with four tapped holes 31c (only two being depicted in FIG. 2) corresponding to the four bolt insertion holes 301e of the frame member 301. The chuck portion 30 is fixed to the body portion 31 in the following manner. The lower surface of the frame member 301 of the chuck portion 30 is brought into contact with the upper surface 31a of the body portion 31. Thereafter, the four bolt insertion holes 301e of the frame member 301 are aligned with the four tapped holes 31c of the body portion 31. Thereafter, four bolts 31d are inserted through the four bolt insertion holes 301e and screwed into the four tapped holes 31c. In this manner, the frame member 301 is fixed to the body portion 31 by the four bolts 31d. Thus, the chuck portion 30 is fixedly supported to the body portion 31.

Referring to FIGS. 1 and 2, a frame fixing jig 4 for fixing the annular frame F supporting the wafer W through the adhesive tape T is also depicted, wherein the frame fixing jig 4 is adapted to be mounted on the chuck table 3. The frame fixing jig 4 is generally composed of a frame support member 40 having an upper surface 401a for supporting the annular frame F and a presser ring 41 for pressing the annular frame F against the frame support member 40. The frame support member 40 is adapted to be provided outside the chuck portion 30 and fixed to the body portion 31 of the chuck table 3. The frame support member 40 has a plurality of (e.g., two in this preferred embodiment) through holes 400 as engaged portions. On the other hand, the presser ring 41 has a plurality of engaging portions 413 adapted to be inserted through the through holes 400 of the frame support member 40, thereby engaging the frame support member 40.

The frame support member 40 is an annular member having an opening 40g. The frame support member 40 is formed of a predetermined alloy or the like. An annular support portion 401 projects from the upper surface of the frame support member 40 along the inner circumference thereof in the +Z direction. The annular support portion 401 has the upper surface 401a for supporting the annular frame F. The upper surface 401a of the annular support portion 401 is formed with a plurality of bolt insertion holes 40d arranged at given intervals in the circumferential direction. For example, four bolt insertion holes 40d are arranged at 90 degrees intervals. These four bolt insertion holes 40d extend through the thickness of the annular support portion 401 of the frame support member 40 in the Z direction. As depicted in FIG. 2, the opening 40g of the frame support member 40 has a diameter smaller than the outer diameter of the annular frame F and larger than the outer diameter of the wafer W. Further, the diameter of the opening 40g is slightly larger than the outer diameter of the frame member 301 of the chuck portion 30 of the chuck table 3, so that the opening 40g is adapted to be fitted to the frame member 301.

As depicted in FIGS. 1 and 2, the upper surface 31a of the body portion 31 of the chuck table 3 is further formed with four tapped holes 31f corresponding to the four bolt insertion holes 40d of the annular support portion 401 of the frame support member 40, at the positions radially outside the four tapped holes 31c. The frame support member 40 is fixed to the body portion of the chuck table 3 in the following manner. The opening 40g of the frame support member 40 is fitted to the chuck portion 30. Thereafter, the four bolt insertion holes 40d of the frame support member 40 are aligned with the four tapped holes 31f of the body portion 31. Thereafter, four bolts 31e are inserted through the four bolt insertion holes 40d and screwed into the four tapped holes 31f. In this manner, the frame support member 40 is fixed to the body portion by the bolts 31e. In this condition, the head of each bolt 31e is sunk in the corresponding bolt insertion hole 40d so as not to project from the upper surface 401a of the annular support portion 401.

As depicted in FIG. 2, the annular support portion 401 of the frame support member 40 forms an annular step height in such a manner that an annular surface 400a lower in height by a predetermined level than the upper surface 401a of the annular support portion 401 is formed radially outside of the annular support portion 401. The plural through holes 400 are arranged at given intervals in the circumferential direction on the annular surface 400a. In this preferred embodiment, the two through holes 400 are arranged at 180 degrees intervals. The two through holes 400 extend through the thickness of the frame support member 40 in its outer circumferential portion in the Z direction. The number of the through holes 400 is not limited to two. For example, four through holes 400 may be arranged at 90 degrees intervals in the circumferential direction of the frame support member 40. As depicted in FIG. 1, the planar shape of each through hole 400 is a rectangular shape corresponding to the outside shape of a plate 413c of each engaging portion 413 of the presser ring 41 as will be hereinafter described. However, the planar shape of each through hole 400 and the outside shape of the plate 413c are not limited to a rectangular shape.

As depicted in FIGS. 1 and 2, the presser ring 41 is also an annular member formed of a predetermined alloy or the like. The presser ring 41 includes an annular base portion 410 and an annular projection 411 projecting from the upper surface of the annular base portion 410 along its inner circumference in the +Z direction. The annular base portion 410 and the annular projection 411 are integral with each other. The inner circumferential surface of the annular base portion 410 and the inner circumferential surface of the annular projection 411 form an engaging hole 41d for engaging the annular support portion 401 of the frame support member 40. As depicted in FIG. 2, the upper end of the annular projection 411 is integrally formed with a flange-like pressing portion 412 horizontally extending in the radially inward direction of the presser ring 41. In fixing the annular frame F by using the presser ring 41, the annular frame F is sandwiched between the lower surface of the pressing portion 412 and the upper surface 401a of the annular support portion 401.

As depicted in FIG. 2, a plurality of through holes 410d are arranged at given intervals in the circumferential direction of the annular base portion 410 on the upper surface thereof. For example, two through holes 410d are arranged at 180 degrees intervals in this preferred embodiment. These through holes 410d extend through the thickness of the annular base portion 410.

Each engaging portion 413 of the presser ring 41 includes a rotating shaft 413a inserted through the corresponding through hole 410d of the annular base portion 410, a knob 413b fixed to the upper end of the rotating shaft 413a, and a plate 413c fixed to the lower end of the rotating shaft 413a. The rotating shaft 413a has an axis extending in the Z direction. The knob 413b is adapted to be rotated by an operator. Accordingly, when the knob 413b is rotated by the operator, the rotating shaft 413a is rotated in the through hole 410d of the annular base portion 410. Further, the rotating shaft 413a has an axisl length such that it is vertically movable in the through hole 410d. For example, the plate 413c fixed to the lower end of the rotating shaft 413a has a rectangular outside shape slightly smaller in size than the rectangular planar shape of each through hole 400 of the frame support member 40. That is, the plate 413c is insertable through the corresponding through hole 400. The plate 413c has a flat upper surface. In engaging each engaging portion 413 of the presser ring 41 with the corresponding through hole 400 of the frame support member 40, the knob 413b is rotated to make the longitudinal direction of the rectangular outside shape of the plate 413c parallel to the longitudinal direction of the rectangular planar shape of the through hole 400. In this condition, the plate 413c is inserted through the through hole 400 until the plate 413c reaches the lower surface 40b of the frame support member 40. Thereafter, the knob 413b is rotated again to rotate the plate 413c so that the longitudinal direction of the rectangular outside shape of the plate 413c becomes different from the longitudinal direction of the rectangular planar shape of the through hole 400. As a result, the plate 413c is prevented from being drawn from the through hole 400 in this condition.

The knob 413b is a disk-shaped member having a diameter larger than the diameter of the rotating shaft 413a, so that the knob 413b is not inserted through the through hole 410d. The upper surface of the knob 413b is formed with a mark line 413h extending in the same direction as the longitudinal direction of the rectangular outside shape of the plate 413c. Accordingly, when the knob 413b is rotated to thereby rotate the plate 413c, the operator can grasp the degree of rotation of the plate 413c by recognizing the direction of extension of the mark line 413h.

As depicted in FIG. 2, a plurality of inclined surfaces 40c is formed around the lower end (the lower surface 40b side) of each through hole 400 of the frame support member 40. For example, two inclined surfaces 40c are formed around the lower end of each through hole 400 in this preferred embodiment. Each inclined surface 40c functions in such a manner that when the plate 413c inserted through the through hole 400 is rotated, the rotating shaft 413a is lowered by the sliding engagement of the plate 413c and the inclined surfaces 40c. As depicted in FIG. 2, the two inclined surfaces 40c are formed on the opposite sides of the through hole 400 in the +X direction depicted by an arrow +X and in the −X direction depicted by an arrow −X in the condition where the longitudinal direction of the rectangular planar shape of the through hole 400 is the same as the Y direction. These two inclined surfaces 40c are inclined downward from the lower end of the through hole 400 in the +X direction and in the −X direction, and each inclined surface 40c has a predetermined area.

For example, when the plate 413c is rotated 90 degrees, the annular frame F is pressed against the frame support member 40 by the presser ring 41. In this case, each inclined surface 40c is formed to have a 90 degrees sectoral shape as viewed in plan.

As a modification, each inclined surface 40c may formed as a semiconical surface. In this case, the plate 413c inserted through the through hole 400 is rotatable 360 degrees, and when the plate 413c is rotated 90 degrees, the annular frame F is fixed by the presser ring 41, whereas when the plate 413c is rotated 180 degrees, the fixed condition of the annular frame F can be canceled.

Figure 3A:
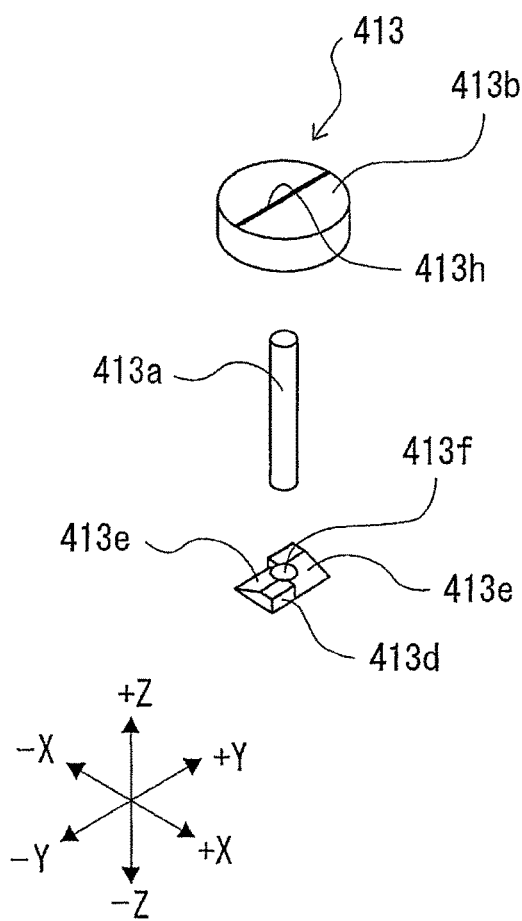
FIG. 3A is an exploded perspective view of an engaging portion as a component of a frame fixing jig according to a modification of the preferred embodiment.
Figure 3B:
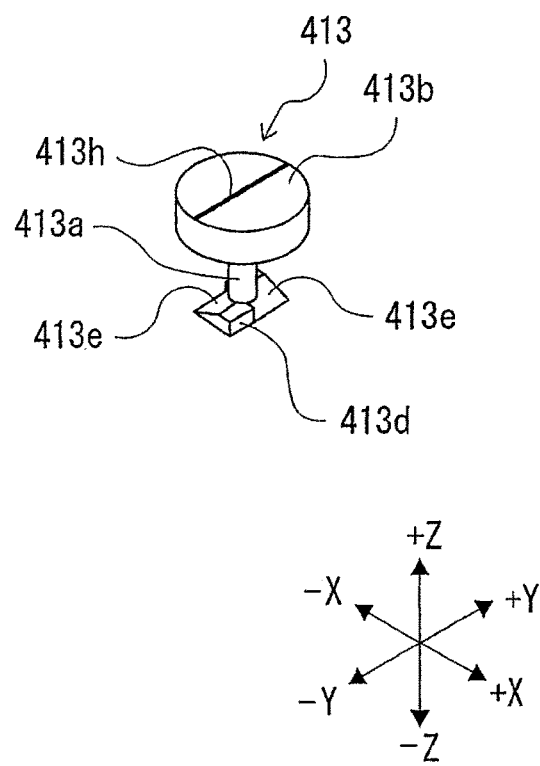
FIG. 3B is a perspective view of the engaging portion depicted in FIG. 3A.

In the frame fixing jig 4 according to this preferred embodiment, the inclined surfaces 40c for lowering the rotating shaft 413a by the rotation of the plate 413c inserted through the through hole 400 are formed around the lower surface 40b side of each through hole 400 as described above. FIGS. 3A and 3B depict a modification of each engaging portion 413. In this modification, each engaging portion 413 includes a rotating shaft 413a, a knob 413b fixed to the upper end of the rotating shaft 413a, and a plate 413d fixed to the lower end of the rotating shaft 413a, wherein the plate 413d is formed with two inclined surfaces 413e for lowering the rotating shaft 413a by the rotation of the plate 413d inserted through the through hole 400. In this modification, flat surfaces are formed around the lower surface 40b side of each through hole 400, that is, not inclined. As depicted in FIGS. 3A and 3B, the plate 413d fixed to the lower end of the rotating shaft 413a is rectangular as viewed in plan and slightly smaller in size than each through hole 400 of the frame support member 40 depicted in FIG. 1. The upper surface of the plate 413d is formed with a flat surface 413f to which the lower end of the rotating shaft 413a is fixed and two inclined surfaces 413e located on the opposite sides of the flat surface 413f in the Y direction. These two inclined surfaces 413e are inclined downward in the +X direction and in the −X direction.

Figure 4:
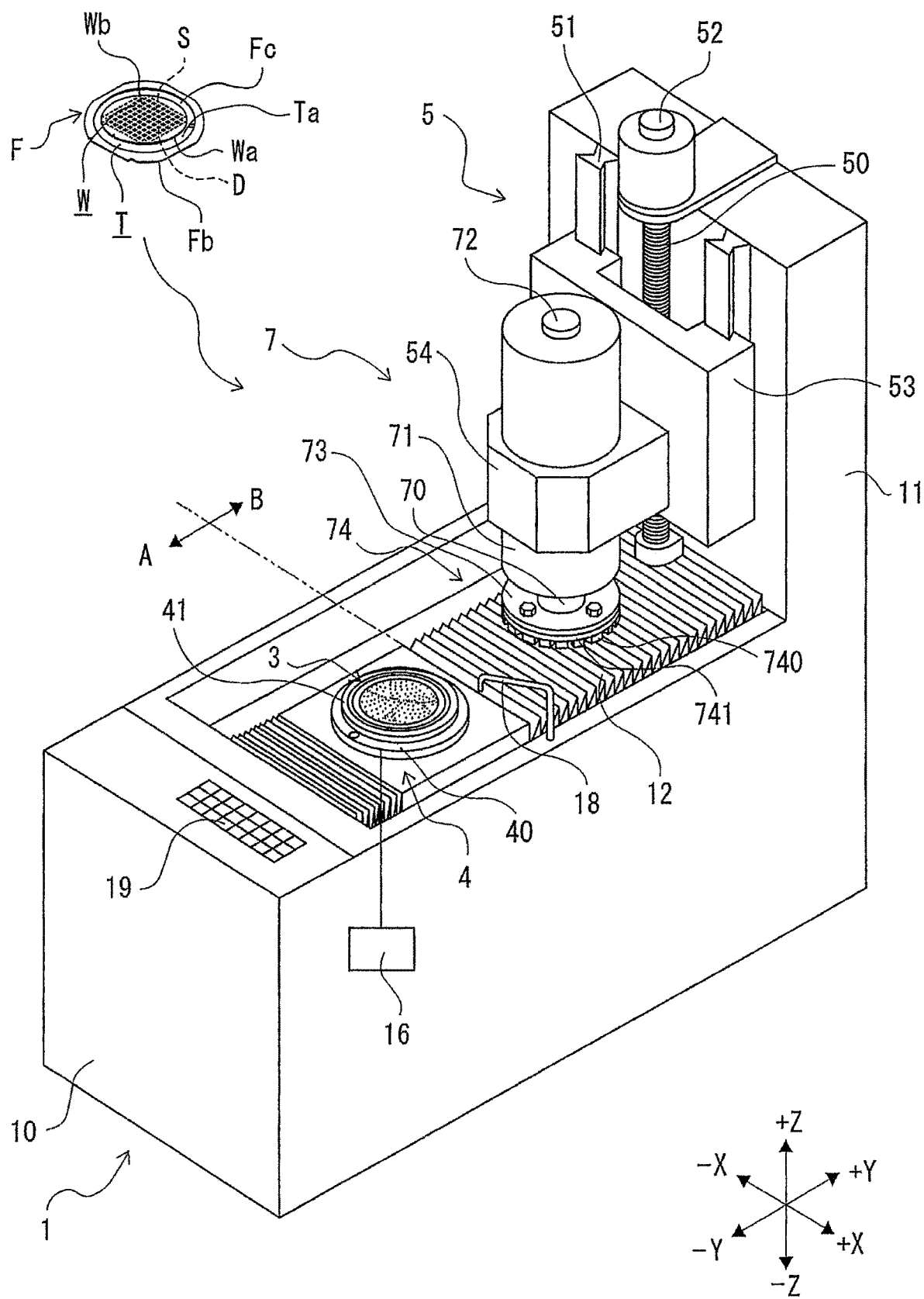
FIG. 4 is a perspective view of a grinding apparatus.

FIG. 4 depicts a grinding apparatus 1 including grinding means 7 for grinding the wafer W held on the chuck table 3, wherein the frame fixing jig 4 is used to fix the annular frame F. The grinding apparatus 1 has a base 10. The base 10 has an upper surface composed of a standby area A and a grinding area B, wherein the standby area A is a front area formed on the −Y side depicted by an arrow −Y, and the grinding area B is a rear side formed on the +Y side depicted by an arrow +Y. In the standby area A, the wafer W is loaded/unloaded to/from the chuck table 3. In the grinding area B, the wafer W held on the chuck table 3 is ground by the grinding means 7. Operating means 19 is provided at the front end of the upper surface of the base 10 so as to be operated by the operator in inputting processing conditions or the like into the grinding apparatus 1.

A column 11 is provided in the grinding area B at the rear end thereof so as to vertically project upward from the upper surface of the base 10. Feeding means 5 is provided on the front surface of the column 11 on the −Y side, so as to vertically move the grinding means 7 toward or away from the chuck table 3. The feeding means 5 includes a ball screw 50 having an axis extending in the vertical direction (Z direction), a pair of guide rails 51 extending parallel to the ball screw 50, a motor 52 connected to the upper end of the ball screw 50 for rotating the ball screw 50, a moving plate 53 having an internal nut threadedly engaging with the ball screw 50 and a pair of sliding portions sliding on the pair of guide rails 51, and a holder 54 connected to the moving plate 53 for holding the grinding means 7. Accordingly, when the motor 52 is operated to rotate the ball screw 50 normally or reversely, the moving plate 53 is vertically moved along the guide rails 51 in the Z direction (+Z direction or −Z direction), so that the grinding means 7 held by the holder 54 is fed in the Z direction.

The grinding means 7 for grinding the wafer W held on the chuck table 3 includes a spindle 70 having an axis extending in the vertical direction (Z direction), a housing 71 for rotatably supporting the spindle 70, a motor 72 for rotating the spindle 70, an annular mount 73 connected to the lower end of the spindle 70, and an annular grinding wheel 74 detachably mounted on the lower surface of the annular mount 73.

The grinding wheel 74 is composed of a wheel base 741 and a plurality of abrasive members 740 fixed to the lower surface of the wheel base 741 so as to be arranged annularly.

Each abrasive member 740 has a substantially rectangular solid shape. Each abrasive member 740 is formed by binding diamond abrasive grains with a resin bond or metal bond, for example. While the plural abrasive members 740 are arranged annularly in this preferred embodiment, a single annular abrasive member may be used.

Although not depicted, a passage for supplying a grinding water is formed in the spindle 70 so as to extend through the spindle 70 in its axial direction (Z direction). One end of this passage is connected to grinding water supplying means for supplying a grinding water, and the other end of this passage is connected through the mount 73 to the lower surface of the wheel base 741. That is, the other end of this passage opens to the lower surface of the wheel base 741 so that the grinding water supplied through this passage is discharged toward the abrasive members 740.

Figure 5:
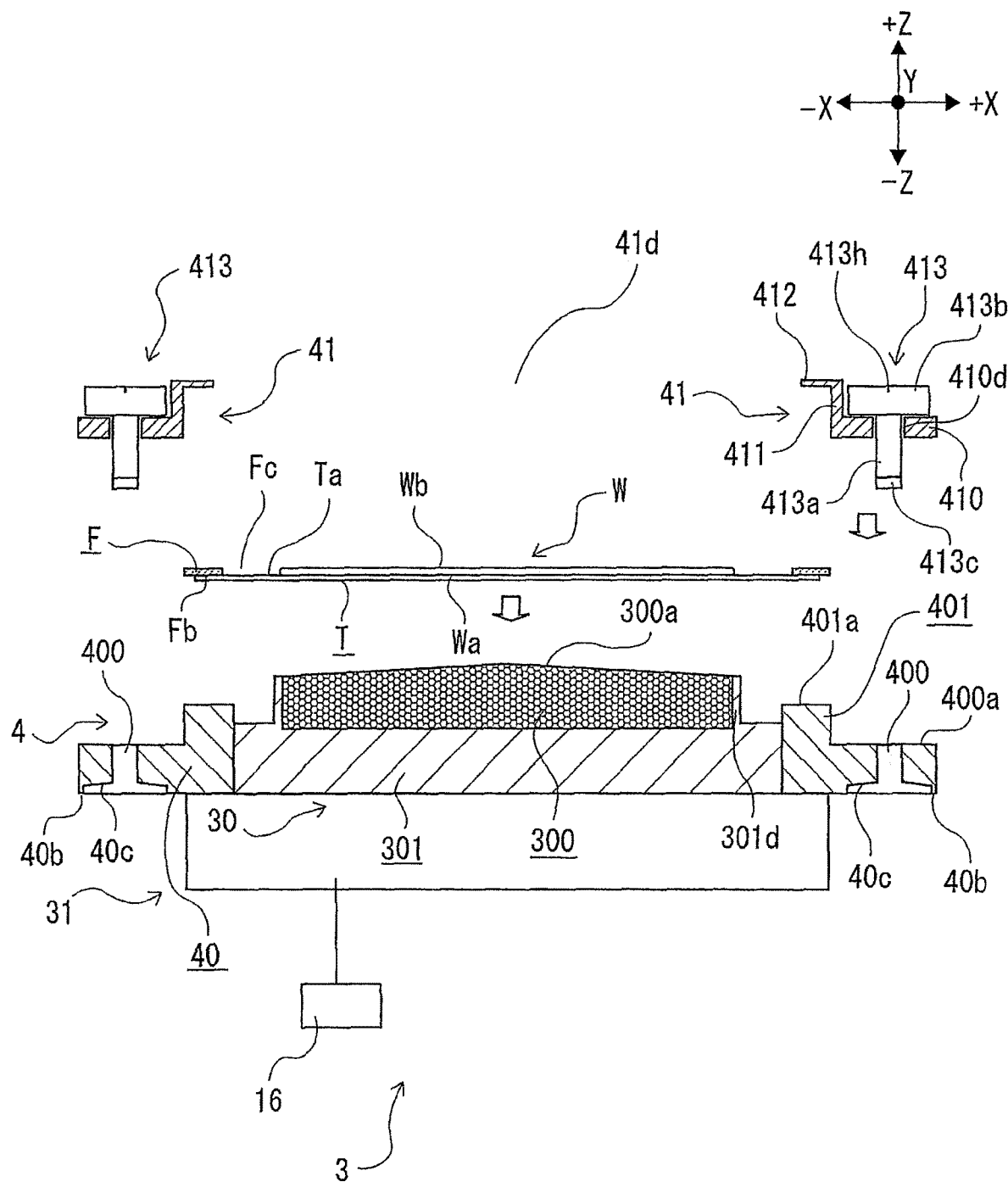
FIG. 5 is a sectional side view depicting a condition before an annular frame supporting the wafer is fixed between a presser ring and a frames support member constituting the frame fixing jig.

The chuck table 3 set in the grinding apparatus 1 is movable in the Y direction by Y moving means 12 and also rotatable about the axis extending in the Z direction by rotating means (not depicted). Further, as depicted in FIG. 5, a tilt adjusting mechanism 16 is provided below the chuck table 3. Although not depicted, the tilt adjusting mechanism 16 includes a shaft portion, a motor for rotating the shaft portion, and a coupling for connecting the shaft portion and the motor. The shaft portion of the tilt adjusting mechanism 16 is vertically movable by operating the motor to rotate the shaft portion, so that the tilt of the holding surface 300a of the chuck table 3 with respect to a horizontal plane can be adjusted.

As depicted in FIG. 4, thickness measuring means 18 is provided in the vicinity of the chuck table 3, so as to measure the thickness of the wafer W held on the chuck table 3. For example, a height gauge for measuring the thickness of the wafer W in a contact manner may be used as the thickness measuring means 18.

There will now be described the operation of the grinding apparatus 1 by the use of the grinding means 7 for grinding the wafer W held on the chuck table 3. In the grinding operation, the wafer W supported through the adhesive tape 7 to the annular frame F is held on the chuck table 3 set in the standby area A depicted in FIG. 4. First, there will be described a procedure of fixing the annular frame F supporting the wafer W to the chuck table 3 by using the frame fixing jig 4 with reference to FIG. 5.

As depicted in FIG. 5, the chuck portion 30 and the body portion 31 of the chuck table 3 are previously united and the frame support member 40 of the frame fixing jig 4 is previously fixed to the body portion 31 of the chuck table 3. Further, the vacuum source (not depicted) is in communication with the holding surface 300a of the chuck table 3, and the tilt of the chuck table 3 is adjustable by the tilt adjusting mechanism 16. In FIG. 5, all of the bolts 31d and 31e, the bolt insertion holes 301e and 40d, and the tapped holes 31c and 31f depicted in FIG. 2 are omitted.

As depicted in FIG. 5, the vertical position of the holding surface 300a of the chuck portion 30 fixed to the body portion 31 is higher by a predetermined level than the vertical position of the upper surface 401a of the annular support portion 401 of the frame support member 40 fixed to the body portion 31. Due to this difference in level between the holding surface 300a and the upper surface 401a, the adhesive tape T attached to the annular frame F can be expanded radially outward when pressing down the annular frame F.

The wafer W supported through the adhesive tape T to the annular frame F is transferred to the chuck table 3 and then positioned so that the center of the wafer W almost coincides with the center of the holding surface 300a of the chuck table 3. Thereafter, the adhesive tape T attached to the front side Wa of the wafer W is brought into contact with the holding surface 300a of the chuck table 3. As a result, the annular frame F is positioned above the frame support member 40 so that the back side Fb of the annular frame F is opposed to the upper surface 401a of the annular support portion 401 with the adhesive tape T interposed therebetween.

Thereafter, the presser ring 41 is transferred to the frame support member 40 and then positioned so that the lower surface of the pressing portion 412 is opposed to the upper surface of the annular frame F and that the axis of the rotating shaft 413a of each engaging portion 413 of the presser ring 41 almost coincides with the axis (axially extending center line) of the corresponding through hole 400 of the frame support member 40.

Further, each engaging portion 413 is rotated so that the longitudinal direction of the rectangular outside shape of the plate 413c coincides with the Y direction as depicted in FIG. 5. Accordingly, the longitudinal direction of the rectangular outside shape of the plate 413c coincides with the longitudinal direction of the rectangular planar shape of each through hole 400. Thereafter, the presser ring 41 is lowered to insert the plate 413c of each engaging portion 413 through the corresponding through hole 400 and also to sandwich the annular frame F and the adhesive tape T between the lower surface of the pressing portion 412 and the upper surface 401a of the annular support portion 401. At the same time, the shape of the wafer W becomes a slightly inclined conical shape following the conical shape of the holding surface 300a of the chuck table 3. Further, the presser ring 41 is lowered to press the annular frame F and the adhesive tape T against the frame support member 40, so that a peripheral portion of the adhesive tape T around the wafer W is mainly gradually expanded radially outward.

Thereafter, the knob 413b of each engaging portion 413 is rotated about the axis of the rotating shaft 413a in the counterclockwise direction as viewed from the +Z side, so that the plate 413c inserted through the corresponding through hole 400 is also rotated in the same direction. During the rotation of the plate 413c, the upper surface of the plate 413c comes into close contact with the inclined surfaces 40c formed around the lower surface 40b side of the through hole 400 of the frame support member 40. Accordingly, the plate 413c is gradually lowered by the sliding contact with the inclined surfaces 40c. As a result, the rotating shaft 413a fixed to the upper surface of the plate 413c is rotated and lowered, so that the lower surface of the knob 413b operates to press down the annular base portion 410 of the presser ring 41. Accordingly, the annular frame F and the adhesive tape T are pressed against the frame support member 40 by the pressing portion 412 of the presser ring 41. Thus, the annular frame F is gradually fixed to the frame support member 40 by the presser ring 41. For example, when the knob 413b is rotated 90 degrees with reference to the mark line 413h to thereby 90 degrees rotate the plate 413c, the upper surface of the annular frame F is set lower in level than the holding surface 300a of the chuck table 3, and the annular frame F supporting the wafer W is fixed on the chuck table 3 by the frame fixing jig 4. Further, the shape of the wafer W becomes a slightly inclined conical shape following the conical shape of the holding surface 300a of the chuck table 3, and the adhesive tape T is expanded radially outward.

In this manner, the annular frame F can be fixed on the chuck table 3 reliably and quickly only by 90 degrees rotating the knob 413b of each engaging portion 413 of the frame fixing jig 4 in this preferred embodiment.

Figure 6:
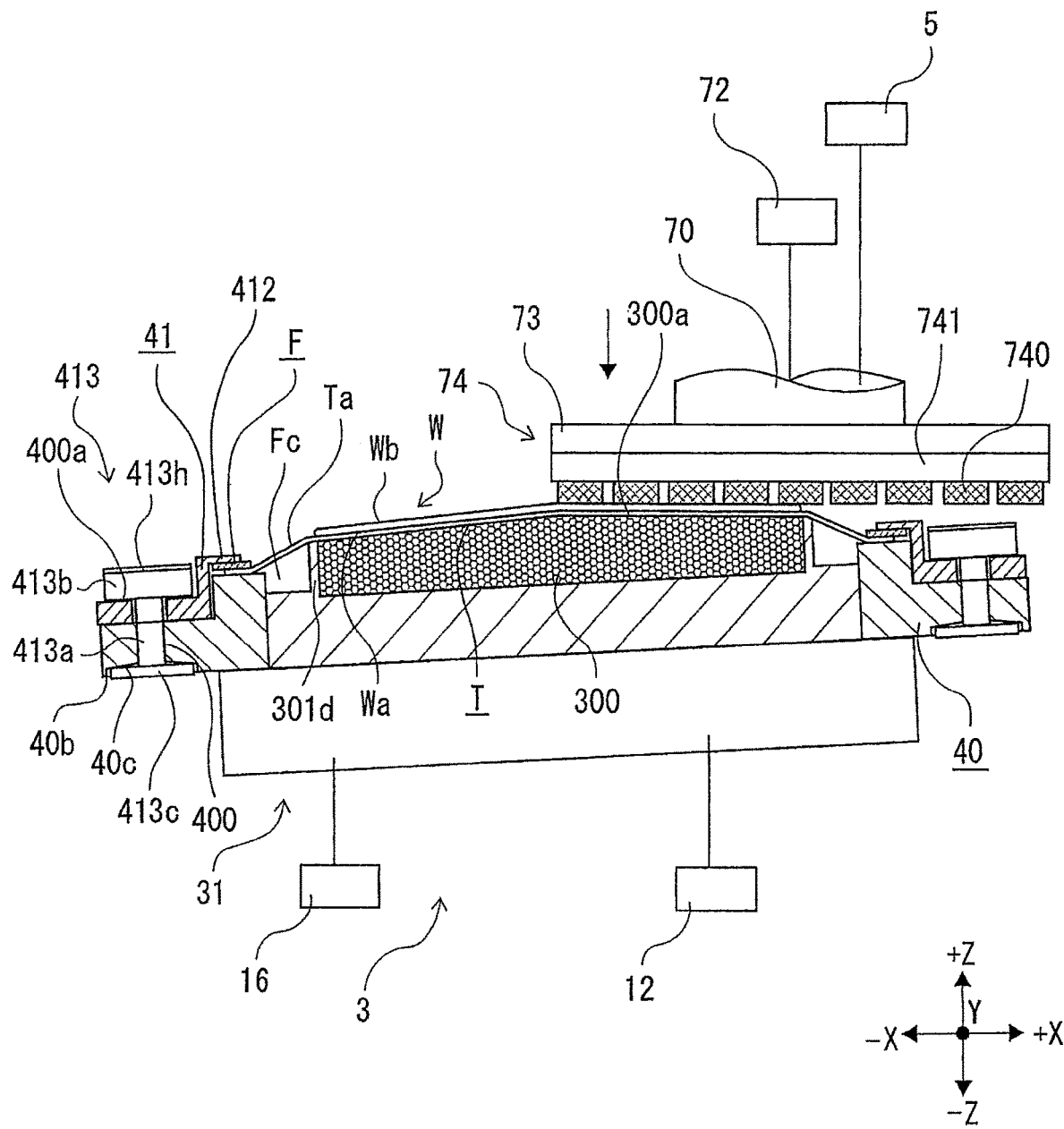
FIG. 6 is a sectional side view depicting a condition where the wafer held on the chuck table is ground by grinding means included in the grinding apparatus depicted in FIG. 4.

Thereafter, a suction force produced by the vacuum source (not depicted) is transmitted to the holding surface 300a of the chuck table 3 depicted in FIG. 6, thereby holding the wafer W through the adhesive tape T on the holding surface 300a of the chuck table 3 under suction.

Thereafter, the chuck table 3 holding the wafer W is moved to the position below the grinding means 7 in the +Y direction depicted in FIG. 4, and the position of the wafer W is set relative to the grinding wheel 74 of the grinding means 7. For example, as depicted in FIG. 6, this positioning is performed in such a manner that the center of rotation of the grinding wheel 74 is shifted from the center of rotation of the chuck table 3 in the +X direction by a predetermined distance and that the locus of rotation of the abrasive members 740 passes through the center of rotation of the chuck table 3.

The shape of the wafer W held on the holding surface 300a is a slightly inclined conical shape following the conical shape of the holding surface 300a. Accordingly, the tilt adjusting mechanism 16 is operated to adjust the tilt of the chuck table 3 in such a manner that the back side Wb of the wafer W becomes parallel to the grinding surface (lower surface) of each abrasive member 740 as depicted in FIG. 6.

Prior to grinding the wafer W by operating the grinding means 7 in the grinding apparatus 1, the thickness measuring means 18 depicted in FIG. 4 is operated to measure the height of the back side Wb of the wafer W held on the chuck table 3 and also measure the height of the upper surface of the pressing portion 412 of the presser ring 41. Then, it is detected whether or not the height of the presser ring 41 is lower than the height of the holding surface 300a of the chuck table 3, i.e., whether or not the annular frame F is properly fixed to the chuck table 3 by the frame fixing jig 4. By the use of the frame fixing jig 4 according to the present invention, the following effect can be obtained. In fixing the annular frame F to the chuck table 3, the operator rotates the knob 413b with reference to the mark line 413h of each engaging portion 413 as visually recognizing that the annular frame F is reliably fixed to the chuck table 3 by the frame fixing jig 4. Accordingly, there is no possibility that improper fixation of the annular frame F may be detected by the thickness measuring means 18 to cause the rqquirement of re-fixation of the annular frame F. That is, time and effort for such re-fixation of the annular frame F can be saved in the present invention.

After positioning the wafer W below the grinding wheel 74, the motor 72 depicted in FIG. 6 is operated to rotate the grinding wheel 74. Further, the feeding means 5 is operated to feed the grinding means 7 in the −Z direction until the abrasive members 740 of the grinding wheel 74 come into contact with the back side Wb of the wafer W, thereby grinding the back side Wb of the wafer W. During this grinding operation, the chuck table 3 is also rotated by the rotating means (not depicted) to thereby rotate the wafer W held on the holding surface 300a, so that the whole surface of the back side Wb of the wafer W is ground by the abrasive members 740. Further, during the grinding operation, a grinding water is supplied to a contact portion between the abrasive members 740 and the wafer W, thereby cooling and cleaning the contact portion between the abrasive members 740 and the wafer W. Further, the thickness measuring means 18 depicted in FIG. 4 is operated to occasionally measure the thickness of the wafer W during the grinding operation.

In grinding the wafer W by using the grinding means 7, a grinding dust is generated from the wafer W. This grinding dust is removed by the grinding water discharged from the grinding means 7 as flowing radially outward on the back side Wb of the wafer W. The grinding water containing the grinding dust further flows on the upper surface of the presser ring 41 and then drops from the outer circumference of the presser ring 41. During the grinding operation, the frame fixing jig 4 according to this preferred embodiment operates so that the lower surface of the knob 413b of each engaging portion 413 of the presser ring 41 is kept in close contact with the upper surface of the annular base portion 410 of the presser ring 41. Accordingly, the grinding water containing the grinding dust does not enter the contact portion between the lower surface of the knob 413b and the upper surface of the annular base portion 410 and accordingly does not enter each through hole 400. In other words, there is no possibility that the grinding dust may enter the contact portion between the lower surface of the knob 413b and the upper surface of the annular base portion 410 and accordingly enter each through hole 400, that is, there is no possibility that the grinding dust may enter any portion where the reliable fixation of the annular frame F is hindered by the deposition of the grinding dust.

After grinding the wafer W by a predetermined amount to finish the grinding operation for this wafer W, the grinding means 7 is moved in the +Z direction by the feeding means 5 to thereby separate the grinding wheel 74 from the wafer W. Further, the rotation of the chuck table 3 is stopped and the chuck table 3 is next moved in the −Y direction depicted in FIG. 4 by operating the Y moving means 12, thereby returning the chuck table 3 to the original position in the standby area A depicted in FIG. 4. Thereafter, the wafer W held on the chuck table 3 is unloaded from the chuck table 3.

The wafer W is unloaded from the chuck table 3 after grinding in the following manner. The operator rotates the knob 413b of each engaging portion 413 in the direction opposite to that in fixing the annular frame W with reference to the mark line 413h, thereby 90 degrees rotating the plate 413c in the same direction. As a result, the fixation of the annular frame F by the presser ring 41 and the frame support member 40 is canceled. In this condition, the plate 413c of each engaging portion 413 can be drawn from the corresponding through hole 400, and the presser ring 41 is next raised to be removed from the frame support member 40. Thereafter, the suction holding of the wafer W on the chuck table 3 is canceled. In this condition, the operator can grasp the annular frame F and safely unload the wafer W from the chuck table 3.

After unloading the wafer W from the chuck table 3, another new wafer W to be ground is next held on the chuck table 3 in the condition where this new wafer W is also supported through an adhesive tape T to an annular frame F. Thereafter, a similar grinding operation is performed to this new wafer W. As described above, the grinding dust; generated in the previous grinding operation is not deposited in each through hole 400 of the frame support member 40, on the upper surface of the annular base portion 410 of the presser ring 41, and on the lower surface of the knob 413b of each engaging portion 413 of the presser ring 41. Accordingly, in fixing the annular frame F supporting the new wafer W to the chuck table 3 by using the frame fixing jig 4, there is no possibility that the fixation of the annular frame F may be hindered by the grinding dust.

The frame fixing jig 4 according to this preferred embodiment is merely illustrative, and the frame fixing jig according to the present invention is not limited to the above preferred embodiment. Further, the configuration, shape, etc. of the chuck table 3, the frame support member 40, and the presser ring 41 are also merely illustrative, and these components are not limited to those depicted in the attached drawings, but may be suitably changed within the scope where the effects of the present invention can be exhibited. For example, the chuck table 3 may be set in a cutting apparatus having a cutting blade for cutting the wafer W, and the frame fixing jig 4 may be used with this chuck table 3 set in the cutting apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A frame fixing jig adapted to be mounted on a chuck table composed of a chuck portion and a body portion for supporting the chuck portion, the chuck portion having a holding surface for holding a workpiece supported through an adhesive tape to an annular frame having an opening, the annular frame being attached to a peripheral portion of the adhesive tape so that the opening is closed by a central portion of the adhesive tape, the workpiece is attached to the central portion of the adhesive tape, the frame fixing jig comprising:
   a frame support member having an upper surface for supporting the annular frame, the frame support member being adapted to be provided outside the chuck portion of the chuck table and fixed to the body portion of the chuck table, the frame support member having a through hole as an engaged portion; and
   a presser ring for pressing the annular frame against the frame support member, the presser ring having an annular base portion and an engaging portion supported by the annular base portion, the engaging portion being adapted to be inserted through both a through hole of the annular base portion and the through hole of the frame support member, thereby engaging the frame support member;
   the engaging portion including a rotating shaft extending through the annular base portion, a knob fixed to the upper end of the rotating shaft, and a plate fixed to the lower end of the rotating shaft;
   the surface around the lower end of the through hole of the frame support member being formed with at least a pair of inclined surfaces, whereby the inclined surfaces are located on opposite sides of the through hole and are inclined downwardly in opposite directions for lowering the rotating shaft by rotating the plate inserted through the through hole;
   whereby when the knob is rotated about the axis of the rotating shaft to thereby rotate the plate, after the rotating shaft and the plate have been inserted through the through hole of the annular base portion and the through hole of the frame support member, the upper surface of the plate comes into sliding contact with the surface around the lower end of the through hole of the frame support member, so that the rotating shaft is lowered by the operation of the inclined surfaces, and a lower surface of the knob is accordingly pressed against the upper surface of the annular base portion of the presser ring, thereby fixing the annular frame to the frame support member.

2. A frame fixing jig adapted to be mounted on a chuck table composed of a chuck portion and a body portion for supporting the chuck portion, the chuck portion having a holding surface for holding a workpiece supported through an adhesive tape to an annular frame having an opening, the annular frame being attached to a peripheral portion of the adhesive tape so that the opening is closed by a central portion of the adhesive tape, the workpiece is attached to the central portion of the adhesive tape, the frame fixing jig comprising:
   a frame support member having an upper surface for supporting the annular frame, the frame support member being adapted to be provided outside the chuck portion of the chuck table and fixed to the body portion of the chuck table, the frame support member having a through hole as an engaged portion; and
   a presser ring for pressing the annular frame against the frame support member, the presser ring having an annular base portion and an engaging portion supported by the annular base portion, the engaging portion being adapted to be inserted through both a through hole of the annular base portion and the through hole of the frame support member, thereby engaging the frame support member;
   the engaging portion including a rotating shaft extending through the annular base portion, a knob fixed to the upper end of the rotating shaft, and a plate fixed to the lower end of the rotating shaft;
   wherein an upper surface of the plate is formed with a pair of inclined surfaces, whereby the inclined surfaces are located on opposite sides of the rotating shaft and are inclined downwardly in opposite directions for lowering the rotating shaft by rotating the plate inserted through the through hole;
   whereby when the knob is rotated about the axis of the rotating shaft to thereby rotate the plate, after the rotating shaft and the plate have been inserted through the through hole of the annular base portion and the through hole of the frame support member, the upper surface of the plate comes into sliding contact with a surface around the lower end of the through hole of the frame support member, so that the rotating shaft is lowered by the operation of the inclined surfaces, and a lower surface of the knob is accordingly pressed against the upper surface of the annular base portion of the presser ring, thereby fixing the annular frame to the frame support member.

* * * * *